(12) United States Patent
Jain (10) Patent No.: US 9,442,150 B2
(45) Date of Patent: Sep. 13, 2016

(54) SYSTEM AND METHOD FOR MONITORING AND CONTROLLING A TRANSFORMER

(71) Applicant: Virginia Transformer Corporation, Roanoke, VA (US)

(72) Inventor: Prabhat Jain, Roanoke, VA (US)

(73) Assignee: VIRGINIA TRANSFORMER CORPORATION, Roanoke, VA (US)

( * ) Notice: Subject to any disclaimer, the term of this patent is extended or adjusted under 35 U.S.C. 154(b) by 830 days.

(21) Appl. No.: 13/716,988

(22) Filed: Dec. 17, 2012

(65) Prior Publication Data

US 2013/0158897 A1     Jun. 20, 2013

Related U.S. Application Data

(60) Provisional application No. 61/576,590, filed on Dec. 16, 2011.

(51) Int. Cl.
*H01F 27/00* (2006.01)
*G01R 31/02* (2006.01)
*G06F 17/00* (2006.01)
*H01F 27/40* (2006.01)

(52) U.S. Cl.
CPC ............. *G01R 31/027* (2013.01); *G06F 17/00* (2013.01); *H01F 27/402* (2013.01); *H01F 2027/404* (2013.01); *H01F 2027/406* (2013.01)

(58) Field of Classification Search
CPC ... G01R 31/027; G06F 17/00; H01F 27/402; H01F 2027/404; H02H 7/04
See application file for complete search history.

(56) References Cited

U.S. PATENT DOCUMENTS

4,654,806 A    3/1987  Poyser et al.
6,906,630 B2   6/2005  Georges et al.

*Primary Examiner* — Mischita Henson
(74) *Attorney, Agent, or Firm* — McGuire Woods LLP (57) ABSTRACT

A system, a method and a computer program to monitor a plurality of transformer operating parameters, as well as to accurately control one or more of the transformer operating parameters. Calculate loss of life and give diagnosis for recovery and provide maintenance notification, monitor the operation of the LTC.

22 Claims, 8 Drawing Sheets

SYSTEM AND METHOD FOR MONITORING AND CONTROLLING A TRANSFORMER

CROSS-REFERENCE TO RELATED APPLICATIONS

This application claims benefit and priority to U.S. Provisional Patent Application No. 61/576,590 filed Dec. 16, 2011, the disclosure of which is incorporated by reference herein in its entirety.

BACKGROUND

1.0 Field of the Disclosure

The present disclosure relates to a system, a method, and a computer program for monitoring a plurality of transformer operating parameters, including temperature, transformer fluid level, pressure, load, gas generation, and the like. The present disclosure further relates to a system, a method, and a computer program for accurately monitoring, analyzing and predicting, and controlling one or more transformer operating parameters, including temperature, transformer fluid level, pressure, transformer life or the like. It further relates to performing diagnosis of the operation of a transformer based on the levels of the parameters, and further the parameters may be communicated on wire/wireless network.

2.0 Related Art

Current electrical power generation systems and electrical power supply systems use a wide variety of transformer designs to transform electrical power from a primary voltage (e.g., input voltage) to a secondary voltage (e.g., output voltage). Electrical transformers are typically used to transfer electrical energy between circuits through inductively coupled conductors.

Transformers generally include a core, wound conductors (i.e., a winding assembly), and a housing, The housing may include a tank that contains transformer liquid, such as, e.g., mineral oil, to insulate and absorb heat from the core and winding assembly, which may be immersed in the transformer liquid. The external walls of the tank: and/or housing may include a plurality of vanes to transfer heat to the ambient environment.

Currently, monitoring systems are implemented to monitor transformer operations, and to detect faults. U.S. Pat. No. 4,654,806 to Thomas D. Poyser, et al., discloses an example of a method and apparatus for monitoring transformers. U.S. Pat. No. 6,906,630 to Bruno Georges, et al., discloses another example of a transformer management system and method.

Since improper performance or transformer failure can result in power disruption, fluctuating power supply, or power outage, loss of transformer life, it is important to provide accurate measurement, analysis and monitoring of transformer parameters, so as to facilitate timely intervention.

SUMMARY OF THE DISCLOSURE

The disclosure provides a system, a method and a computer program to monitor a plurality of transformer operating parameters, and to control or facilitate control of Attorney transformer parameters for optimal transformer performance, including the diagnosis, and access and control of the parameters on the wire/wireless network. It also provides information on the various tap positions of the LTC. Further it also predicts the percentage of loss of life based on the loading and other parameters. Other parameters may include internal temperature and outside temperature. It also provides the condition of possible faults in the transformer based on the inputs from the gas analyzer.

In one aspect, a system for monitoring operating parameters of a transformer is provided that includes a temperature sensor that measures temperature in the transformer and outputs a temperature signal, a fluid level sensor that measures a level of fluid in the transformer and outputs a fluid level signal, a pressure sensor that measures pressure in the transformer and outputs a pressure signal and a processor that receives the temperature signal, the fluid level signal, and the pressure signal, wherein the processor is configured to generate a diagnosis signal based on at least one of the temperature signal, fluid level signal, and pressure signal. The system may further comprise a current transmitter that measures the current in the transformer and outputs a current signal and a temperature sensor that measures the ambient temperature of the transformer and outputs an ambient temperature signal, wherein the processor is configured to generate a diagnosis signal based on at least one of the current signal and the ambient temperature signal. The system may further comprise a gas analyzer to provide a signal for gases generated in the transformer wherein the processor is configured to generate a diagnosis signal based on the signal for gases.

In one aspect, a method for monitoring or controlling a transformer includes the steps of sending at least one threshold value to a transformer monitoring device, receiving at least one signal from the transformer monitoring device indicative of a condition of a transformer that exceeded the at least one threshold value and raising an alarm indicating a potential fault at the transformer. The method may further include at least one of the following steps: receiving a temperature signal from the transformer monitoring device indicative of a temperature of the transformer, receiving a fluid level signal from the transformer monitoring device indicative of a fluid level in the transformer, receiving a pressure level signal from the transformer monitoring device indicative of an amount of pressure in the transformer, receiving a current signal from the transformer monitoring device indicative of a current in the transformer, receiving an ambient temperature signal from the transformer monitoring device indicative of ambient temperature of the transformer, receiving a gas signal from the transformer monitoring device indicating a level of gases generated in the transformer, receiving a LTC position signal from the transformer monitoring device indicative of a position of the LTC position, monitoring a rate of change in the temperature signal, a rate of change in the fluid level signal and a rate of change in the pressure level and outputting a signal based on a threshold being exceeded between any of these rate of change signals for determining a fault, calculating a percent loss of life of the transformer based on at least one of the signals exceeding a parameter, wherein the step of raising an alarm raises an alarm based on at least one of the signals. The method may further include the following steps receiving a temperature signal from the transformer monitoring device indicative of a temperature of the transformer, receiving a fluid level signal from the transformer monitoring device indicative of a fluid level in the transformer, receiving a pressure level signal from the transformer monitoring device indicative of an amount of pressure in the transformer; receiving a current signal from the transformer monitoring device indicative of current in the transformer, receiving an ambient temperature signal from the transformer monitoring device indicative of ambient temperature of the transformer, receiving a gas signal from the transformer monitoring device indicating a level of gases generated in the transformer, receiving a LTC position signal from the transformer monitoring device indicative of a position of the LTC position, monitoring a rate of change in the temperature signal, a rate of change in the fluid level signal and a rate of change in the pressure level and outputting a signal based on a threshold being exceeded between any of these rate of change signals for determining a fault, calculating a percent loss of life of the transformer based on at least one of the signals exceeding a parameter, wherein the step of raising an alarm raises an alarm based on at least any of the signals, or the calculated percent loss of life. Moreover, in each of the receiving steps, each respective signal may be received over a wireless link. The method for monitoring or controlling a transformer may include all of the steps. Alternatively, the method for monitoring or controlling a transformer may include any combination of the steps.

In one aspect, a computer program embodied on a computer readable storage medium is provided, the computer program comprising executable code that when read and executed by a processor performs the following steps receiving a temperature signal from a transformer monitoring device indicative of a temperature of a transformer, receiving a fluid level signal from the transformer monitoring device indicative of a fluid level in the transformer, receiving a pressure level signal from the transformer monitoring device indicative of an amount of pressure in the transformer, receiving a current signal from the transformer monitoring device a current transmitter that measures the current in the transformer and outputs a current signal, receiving an ambient temperature signal from the transformer monitoring device indicative of ambient temperature of the transformer, receiving a gas signal from the transformer monitoring device indicating a level of gases generated in the transformer, receiving a LTC position signal from the transformer monitoring device indicative of a position of the LTC position, monitoring a rate of change in the temperature signal, a rate of change in the fluid level signal and a rate of change in the pressure level and outputting a signal based on a threshold being exceeded between any of these rate of change signals for determining a fault, calculating a percent loss of life of the transformer based on at least one of the signals exceeding a parameter and raising an alarm based on at least one of: any of the signals and calculated percent loss of life of the transformer.

Additional features, advantages, and embodiments of the disclosure may be set forth or apparent from consideration of the detailed description and drawings. Moreover, it is noted that the foregoing summary of the disclosure and the following detailed description and drawings provide non-limiting examples of the disclosure, which are intended to provide explanation without limiting the scope of the disclosure as claimed.

BRIEF DESCRIPTION OF THE DRAWINGS

The accompanying drawings, which are included to provide a further understanding of the disclosure, are incorporated in and constitute a part of this specification, illustrate embodiments of the disclosure and together with the detailed description serve to explain the principles of the disclosure. No attempt is made to show structural details of the disclosure in more detail than may be necessary for a fundamental understanding of the disclosure and the various ways in which it may be practiced. In the drawings.

The present disclosure is further described in the detailed description that follows.

DETAILED DESCRIPTION OF THE DISCLOSURE

The disclosure and the various features and advantageous details thereof are explained more fully "with reference to the non-limiting embodiments and examples that are described and/or illustrated in the accompanying drawings and detailed in the following description. It is noted that the features illustrated in the drawings and attachment are not necessarily drawn to scale, and features of one embodiment may be employed with other embodiments as the skilled artisan would recognize, even if not explicitly stated herein. Descriptions of well-known components and processing techniques may be omitted so as to not unnecessarily obscure the embodiments of the disclosure. The examples used herein are intended merely to facilitate an understanding of ways in which the disclosure may be practiced and to further enable those of skill in the art to practice the embodiments of the disclosure. Accordingly, the examples and embodiments herein should not be construed as limiting the scope of the disclosure. Moreover, it is noted that like reference numerals represent similar parts throughout the several views of the drawings.

A "computer," as used in this disclosure, means any machine, device, circuit, component, or module, or any system of machines, devices, circuits, components, modules, or the like, which are capable of manipulating data according to one or more instructions, such as, for example, without limitation, a processor, a microprocessor, a programmable logical controller, a central processing unit, a general purpose computer, a super computer, a personal computer, a laptop computer, a palmtop computer, a notebook computer, a cloud computer, a desktop computer, a workstation computer, a server, or the like, or an array of processors, microprocessors, central processing units, general purpose computers, super computers, personal computers, laptop computers, palmtop computers, notebook computers, desktop computers, workstation computers, servers, or the like.

A "server," as used in this disclosure, means any combination of software and/or hardware, including at least one application and/or at least one computer to perform services for connected clients as part of a client-server architecture. The at least one server application may include, but is not limited to, for example, an application program that can accept connections to service requests from clients by sending back responses to the clients. The server may be configured to run the at least one application, often under heavy workloads, unattended, for extended periods of time with minimal human direction. The server may include a plurality of computers configured, with the at least one application being divided among the computers depending upon the workload.

For example, under light loading, the at least one application can run on a single computer. However, under heavy loading, multiple computers may be required to run the at least one application. The server, or any if its computers, may also be used as a workstation.

A "database," as used in this disclosure, means any combination of software and/or hardware, including at least one application and/or at least one computer. The database may include a structured collection of records or data organized according to a database model, such as, for example, but not limited to at least one of a relational model, a hierarchical model, a network model or the like. The database may include a database management system application (DBMS) as is known in the art. The at least one application may include, but is not limited to, for example, an application program that can accept connections to service requests from clients by sending back responses to the clients. The database may be configured to run the at least one application, often under heavy workloads, unattended, for extended periods of time with minimal human direction.

A "communication link," as used in this disclosure, means a wired and/or wireless medium that conveys data or information between at least two points. The, wired or, wireless medium may include, for example, a metallic conductor link, a radio frequency (RF) communication link, an Infrared (IR) communication link, an optical communication link, or the like, without limitation. The RF communication link: may include, for example, Ethernet, WiFi, WiMAX, IEEE 802.11, DECT, 0G, 1G, 2G, 3G or 4G cellular standards, Bluetooth, and the like.

A "network", as used in this disclosure means, but is not limited to, for example, at least one of a local area network: (LAN), a wide area network (WAN), a metropolitan area network (MAN), a personal area network (PAN), a campus area network:, a corporate area network, a global area network (GAN), a broadband area network (BAN), a cellular network, the Internet, or the like, or any combination of the foregoing, any of which may be configured to communicate data via a wireless and/or a wired communication medium. These networks may run a variety of protocols not limited to TCP/IP, IRC or HTTP.

The terms "including," "comprising," and variations thereof, as used in this disclosure, mean "including, but not limited to," unless expressly specified otherwise.

The terms "a," "an," and "the," as used in this disclosure, means "one or more," unless expressly specified otherwise.

Devices that are in communication with each other need not be in continuous communication with each other, unless expressly specified otherwise. In addition, devices that are in communication with each other may communicate directly or indirectly through one or more intermediaries.

Although process steps, method steps, algorithms, or the like, may be described in a sequential order, such processes, methods and algorithms may be configured to work in alternate orders. In other words, any sequence or order of steps that may be described does not necessarily indicate a requirement that the steps be performed in that order. The steps of the processes, methods or algorithms described herein may be performed in any order practical. Further, some steps may be performed simultaneously.

When a single device or article is described herein, it will be readily apparent that more than one device or article may be used in place of a single device or article. Similarly, where more than one device or article is described herein, it will be readily apparent that a single device or article may be used in place of the more than one device or article. The functionality or the features of a device may be alternatively embodied by one or more other devices which are not explicitly described as having such functionality or features.

A "computer-readable medium," as used in this disclosure, means any medium that participates in providing data (for example, instructions) which may be read by a computer, Such a medium may take many forms, including non-volatile media, volatile media, and transmission media. Non-volatile media may include, for example, optical or magnetic disks and other persistent memory. Volatile media may include dynamic random access memory (DRAM). Transmission media may include coaxial cables, copper wire and fiber optics, including the wires that comprise a system bus coupled to the processor. Transmission media may include or convey acoustic waves, light waves and electromagnetic emissions, such as those generated during radio frequency (RF) and infrared (IR) data communications. Common forms of computer readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, an EPROM, a FLASH-EEPROM, any other memory chip or cartridge, a carrier wave as described hereinafter, or any other medium from which a computer can read. The computer-readable medium may include a "Cloud," which includes a distribution of files across multiple (e.g., thousands of) memory caches on multiple (e.g., thousands of) computers.

Various forms of computer readable media may be involved in carrying sequences of instructions to a computer. For example, sequences of instruction (i) may be delivered from a RAM to a processor, (ii) may be carried over a wireless transmission medium, and/or (iii) may be formatted according to numerous formats, standards or protocols, including, for example, WiFi, WiMAX, IEEE 802.11, DECT, 0G, 1G, 2G, 3G or 4G cellular standards, Bluetooth, or the like.

Figure 1:
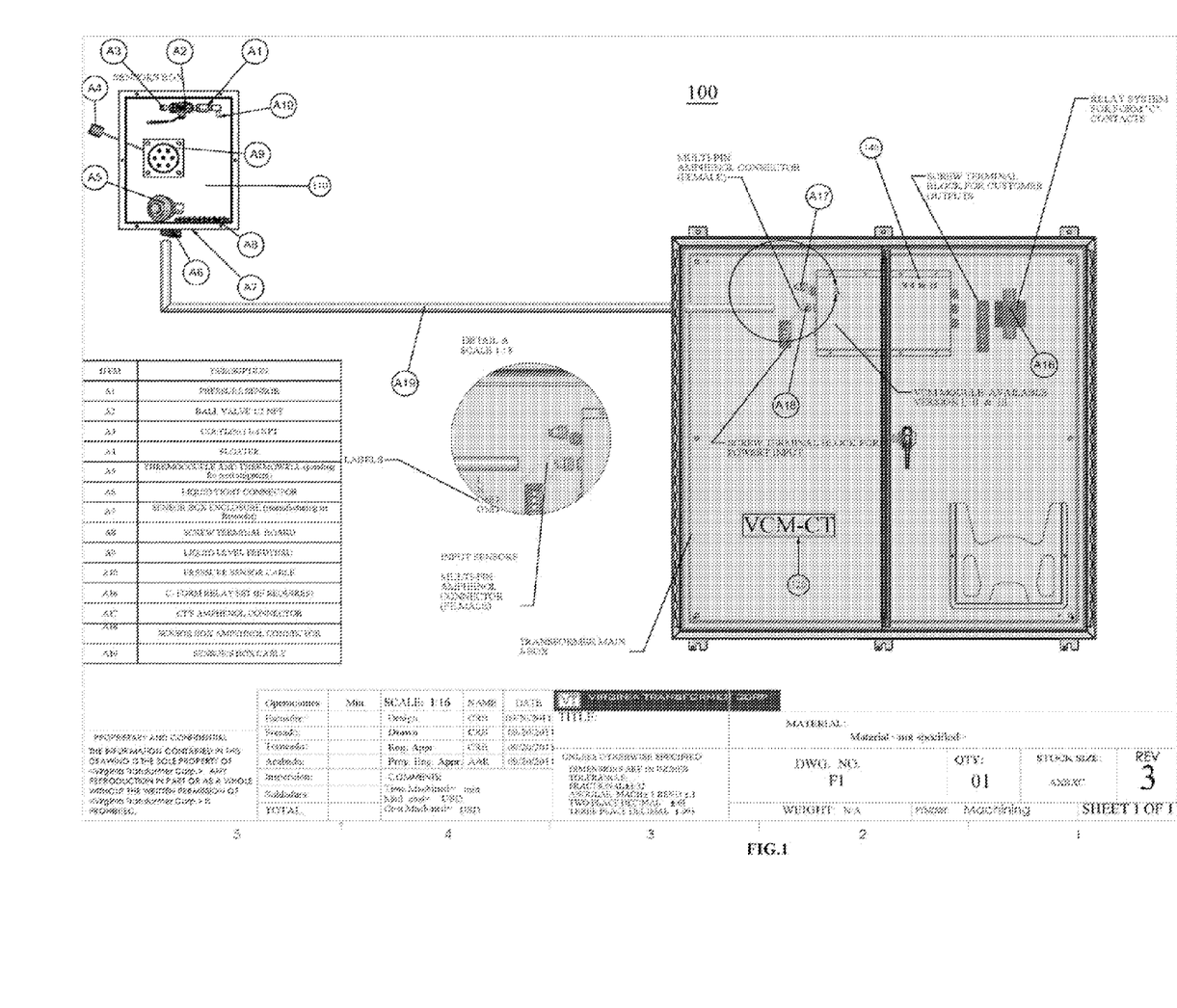
FIG. 1 shows an example of a transformer monitoring system.

FIG. 1 shows an example of a transformer monitoring/control (TMC) system 100, constructed according to the principles of the disclosure. The TMC system 100 includes a sensor box 110, an alternating current (AC) transmitter 120, a transformer main box 130, and a transformer control/monitoring module (VCM) 140. The TMC system 100 further includes the components 1-20 as noted in FIG. 1, which forms part of the instant specification. The sensor box 110 may include, or it may be coupled to, a plurality of sensors, including a temperature sensor, a transformer fluid level sensor, a pressure sensor, ambient sensor and the like. As described below, VMC 14, VCM 140 and VCM 1400 are examples of different variants of a transformer control/monitoring module, which may include one or more features from one another variant.

Figure 2:
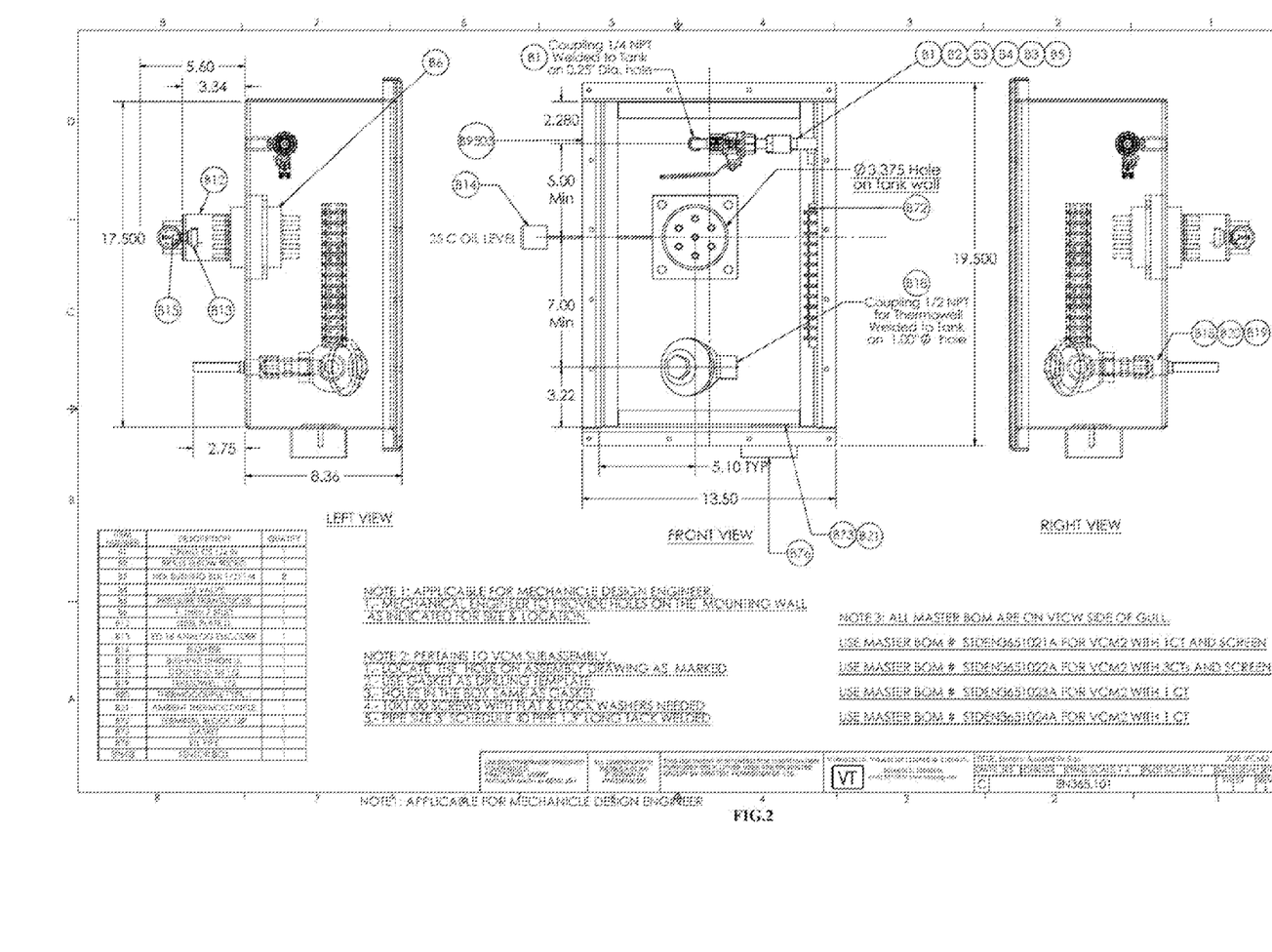
FIG. 2 shows an example of a sensor box including a left view, front view and right view.

FIG. 2 shows an example of the sensor box 110, including, e.g., a ball valve, a LL assembly, a pressure sensor, a screw terminal block, and a thermowell, as labeled in FIG. 2.

Figure 3A:
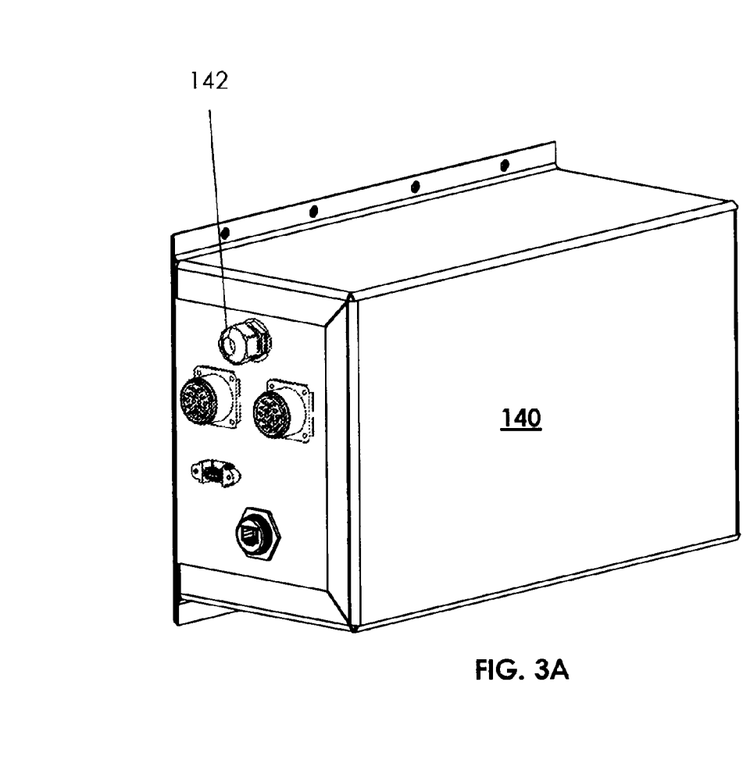
FIGS. 3A and 3B show front and left and right perspective views, respectively, of an example of a transformer control/monitoring module (VCM)
Figure 3B:
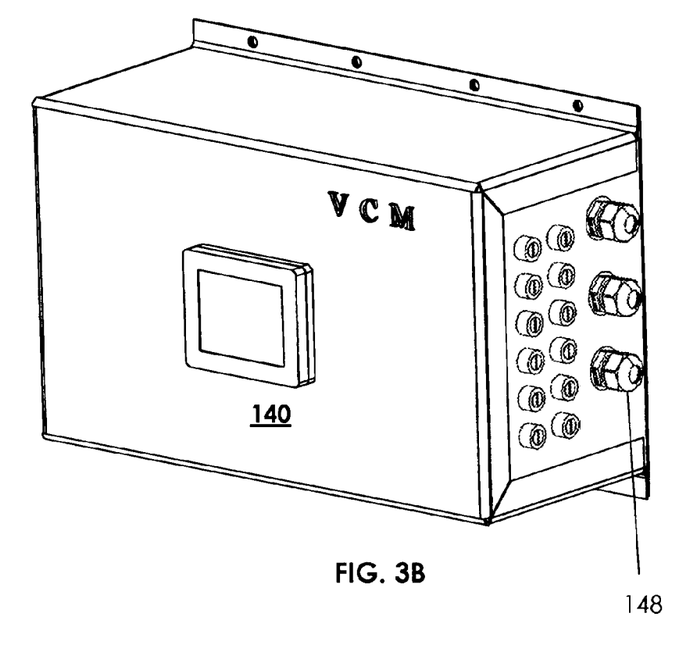

FIGS. 3A and 3B show front and back perspective views, respectively, of an example of the VCM 140. The VCM 140 includes housing with a front panel (VCM2 Screen) and left panel 142 and a right panel 148. The left panel 142 may include a plurality of inputs. The right panel 148 may include a plurality of outputs. The VCM 140 housing may be adapted to be fixable to a wall (e.g., a transformer wall) or other planar surface via a fastening mechanism, such as, for example, a plurality of welds, screws, bolts, nuts, rivets, or the like.

Figure 4:
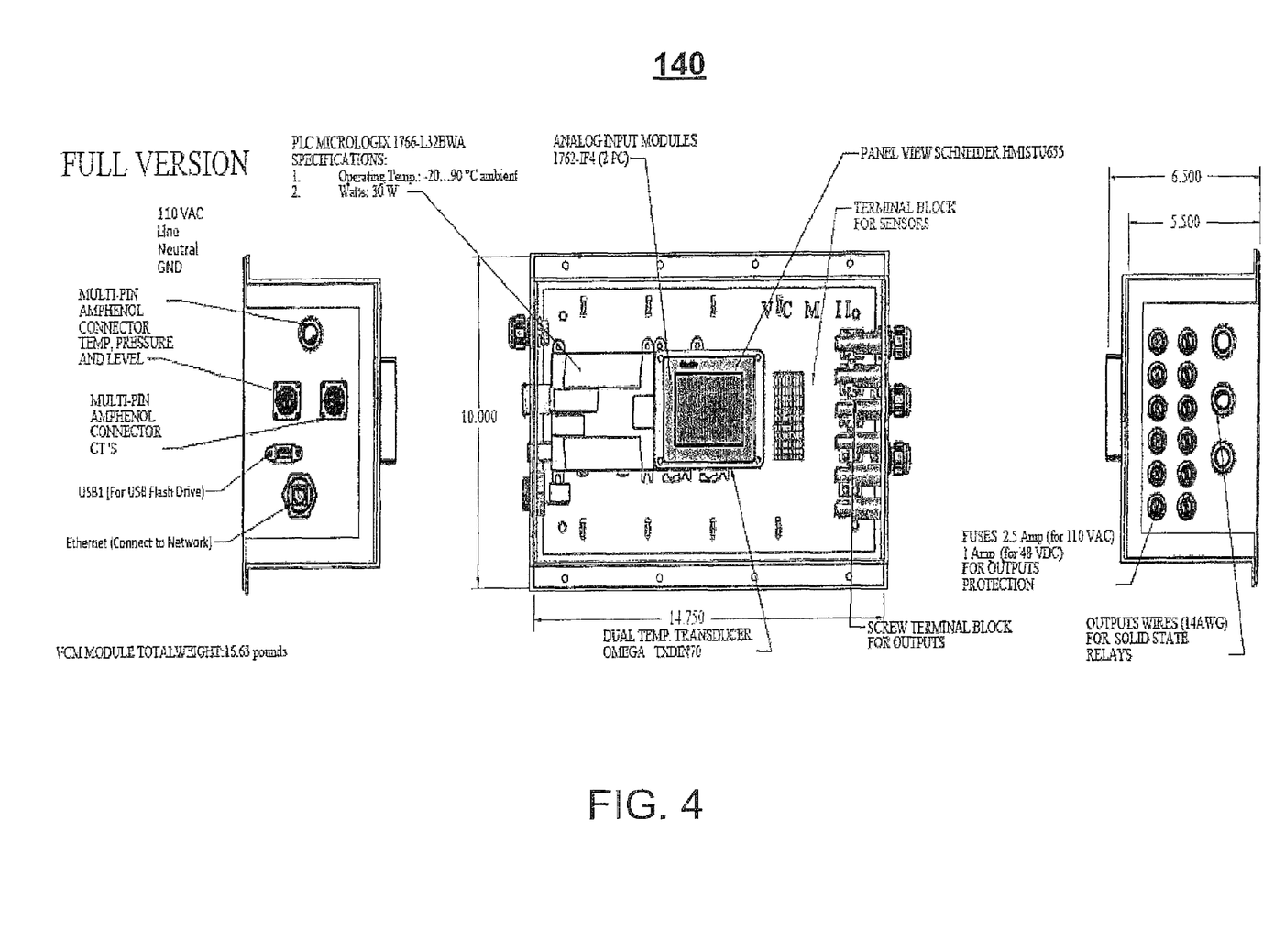
FIG. 4 shows a front view, a side view, and a back view of the VCM of FIGS. 3A, 3B.

FIG. 4 shows a front view, a left side view, and a right side view of a full version VCM 140. The VCM 140 may include a power supply input (e.g., 110 VAC), a multi-pin amphenol connector, a USB connector, a network connector (e.g., Ethernet), a PLC module (e.g., such as PLC Micrologix 1766-L32BWA), one or more analog input modules (e.g., such as 1762-IF4 (2PC)), a panel (e.g., such as Schneider HMISTU655), a terminal block for sensors, a dual temperature transducer (e.g., such as Omega TXDIN70), a screw-terminal block, a plurality of fuses, and a plurality of outputs.

Figure 5:
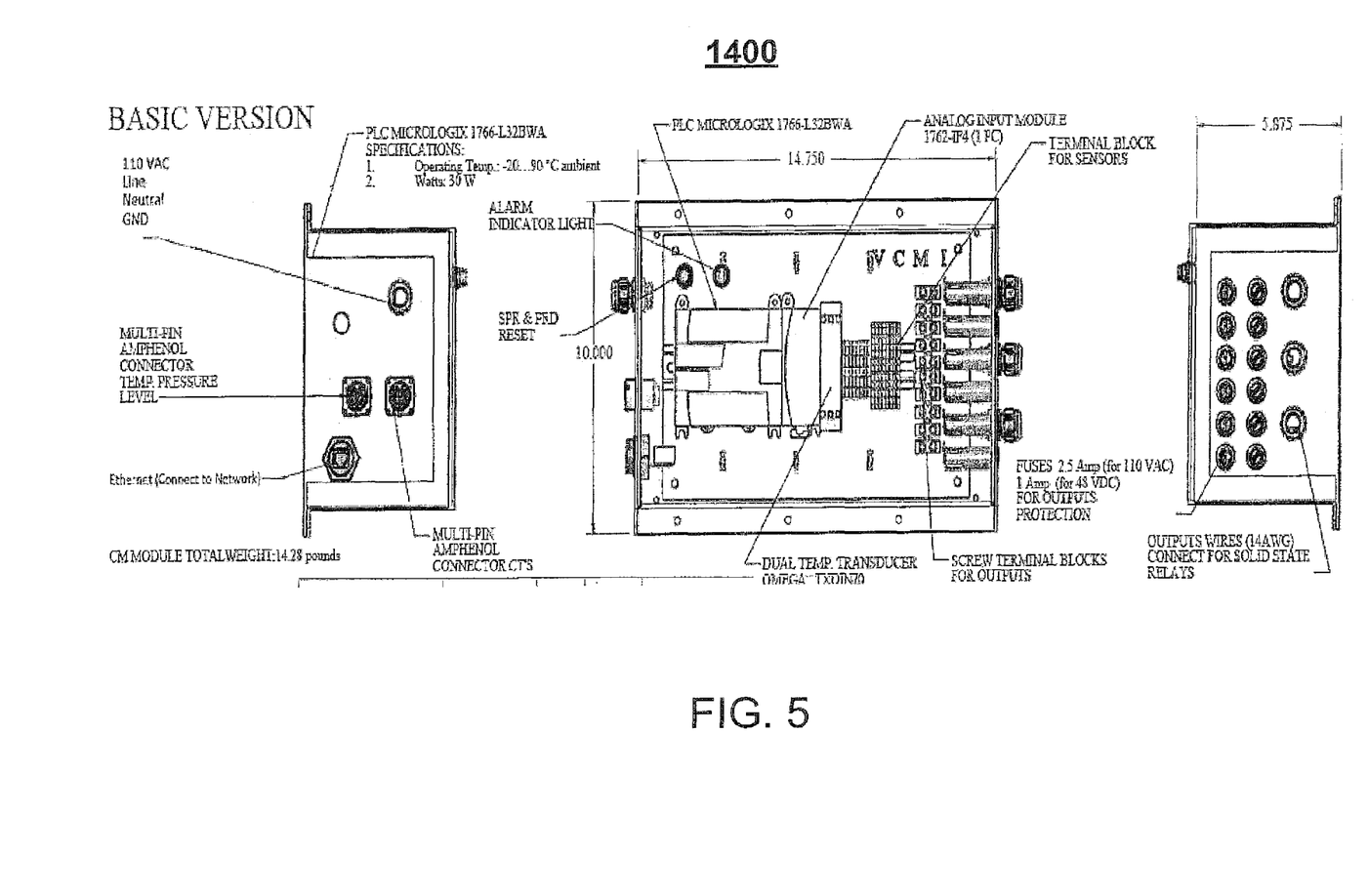
FIG. 5 shows a front view, a side view, and a back view of another example of a VCM.

FIG. 5 shows a front view, a left side view, and a right side view of another example of a VCM, a basic version VCM 1400. The VCM 1400 may be similarly configured to the VCM 140. The VCM 1400 may further include an alarm indicator light, and a SPR & PRD reset.

Figure 6:
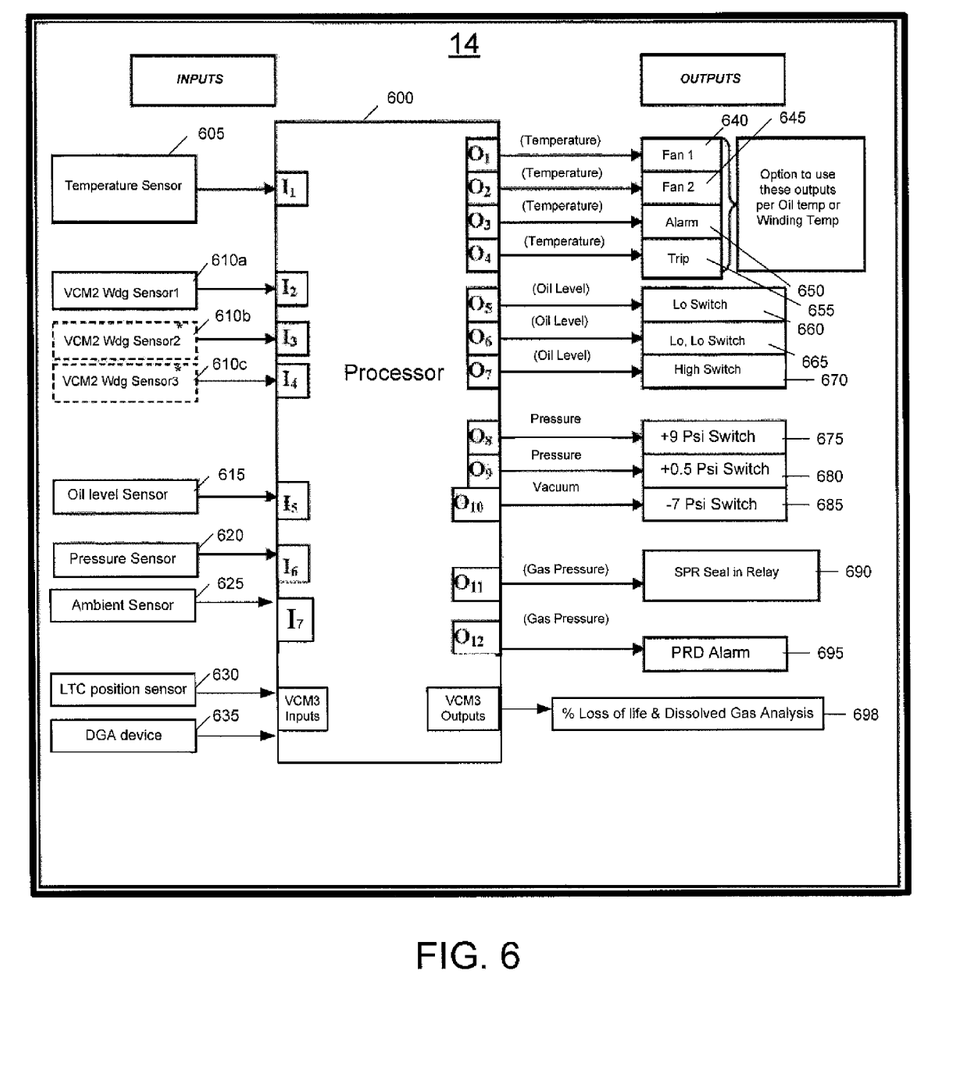
FIG. 6 shows a schematic view of the VCM of FIGS. 3A, 3B.

FIG. 6 shows a schematic view of an example of a VCM 14 constructed according to the principles of the disclosure. The VCM 14 may include a processor (or computer) 600, a plurality of inputs and a plurality of outputs. The VCM 14 may be coupled to a plurality of sensors associated with a transformer for monitoring the state of the transformer, including an oil temperature sensor 605, at least one WTI CT transmitter sensor(s) 610*a*-610*c*, an oil level sensor 615, a gas pressure sensor 620, ambient sensor 625 and a LTC position sensor 630. A dissolved gas analyzer 635 may also provide inputs to the processor 600. The VCM 14 may be coupled to a plurality of relays, switches, actuators, and the like, including, for example, a temperature fan-1 relay 640, a temperature fan-2 relay 645, a temperature alarm relay 650, a temperature trip relay 655, an oil level Lo switch 660, an oil level Lo Lo switch 665, an oil level High switch 670, a pressure switch (+9 Psi) 675, a pressure switch (+0.5) 680, a vacuum relay (−7 Psi) 685, a gas pressure SPR seal in relay activation relay 690, and a gas pressure PRD alarm activation relay 695. The processor may output percentage loss of life and dissolved gas analysis 698.

In some applications, the VCM 14 may be configured to take the inputs from the LTC position sensor, and may raise an alert when the LTC tap is at minimum tap position, maximum tap position, nominal tap position and when the tap struck between two taps. Also it provides the LTC operation counter information.

In some versions, the VCM 14 may be configured to calculate the percentage loss of life values of the transformer based on the algorithm developed based on one or more of: thermal capacity of the transformer (time constant), oil- and winding-time constants, winding gradients and hot-spot temperatures, loading of the transformer, the standards on loading guide such as IEEE Std C57.91 and the ambient temperature. Any of these may be taken into account in the algorithm to compute the percentage loss of life. Many of the parameters may be aggregated over time to account for the thermal time constant, hot spot temperature is monitored/calculated and used as one of the parameters to calculate the loss of life. It can track the loss of life over a certain period of time and indicate the trend. Also it may alert (e.g., raise an alarm) the customer when a threshold value (i.e., a parameter is exceeded) of the % loss of life is reached.

In some versions, the VCM 14 may be configured to receive inputs (i.e., gas signals) from the gas analyzer devices based on the algorithm based on the quantities and the rates of the gases generated and determines the status of the transformer in scale of conditions 1 through 4 as defined in the IEEE Std C57.104, provides tracking of the trend of the gases and recommends actions to be taken based on the trend and severity of condition above. Input and output details are added to the FIG. 6.

Figure 7:
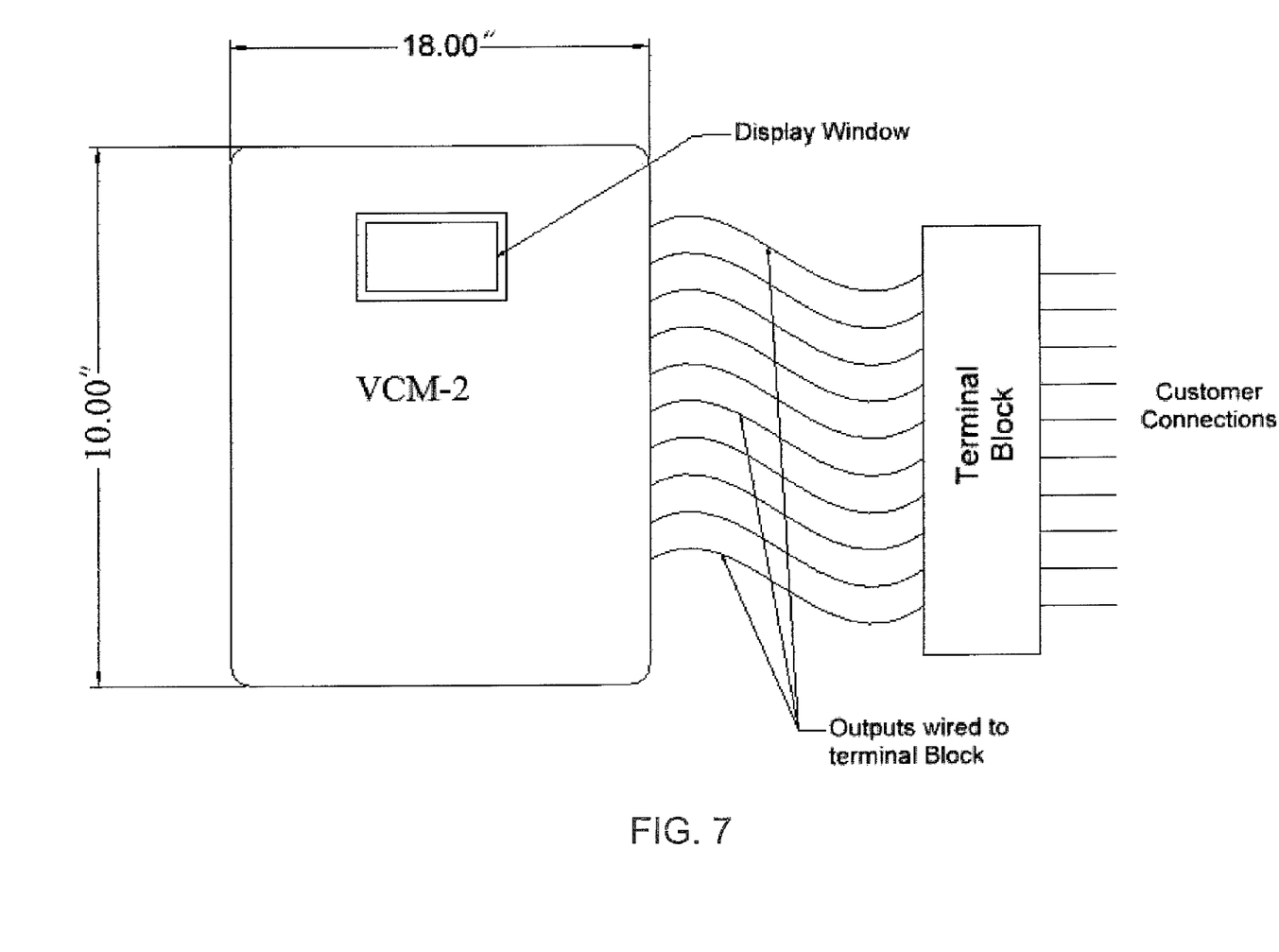
FIG. 7 shows an example of a VCM coupled to a terminal block.

FIG. 7 shows an example of the VCM 14 coupled to a terminal block that leads to a customer's connections, according to the principles of the disclosure.

Figure 8:
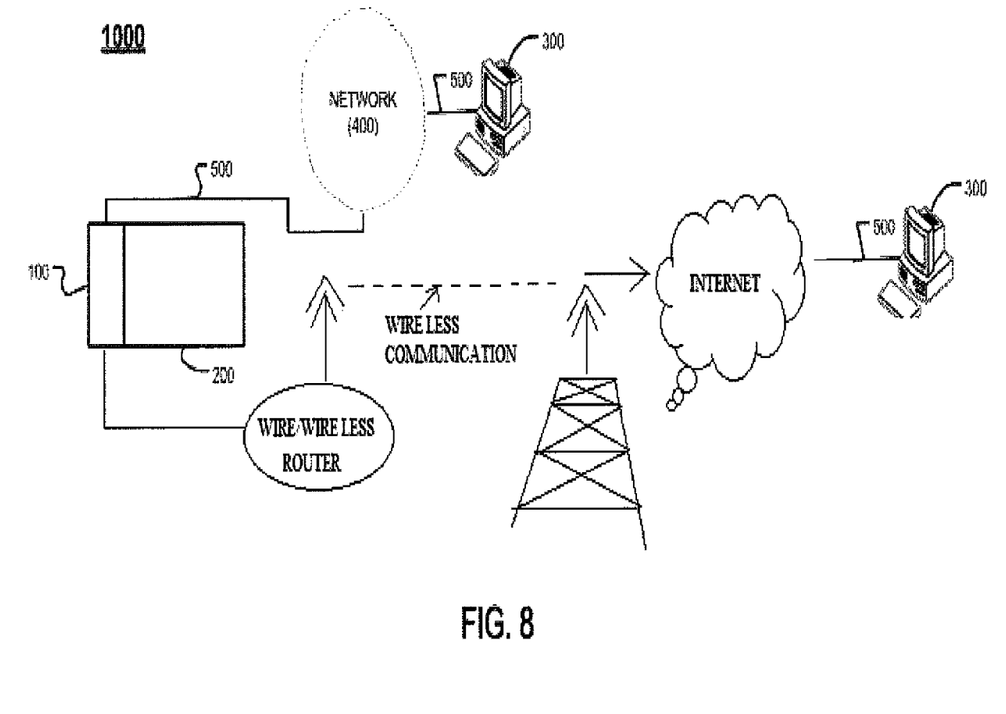
FIG. 8 shows an example of a VCM communication system.

FIG. 8 shows a VCM communication system 1000, constructed according to the principles of the disclosure. The VCM system 1000 includes the TMC system 100, which may be coupled to a transformer 200, a computer 300, and a network 400, all of which may be coupled via communication links 500. The TMC system 100 may be located remotely from the transformer 200, in which case a plurality of sensors may be located at (or near, or in) the transformer 200, each of which may be coupled to the TMC system 100. VCM system 1000 may be configured to communicate data using wireless communication technology. VCM 100 may send data through a wire/wireless Router. Computer 300 may receive or send data via an internet service provider (ISP). The wireless and wired communication may be supervisory control and data acquisition (SCADA) compatible. The data can be received, and communication established with a user using this wireless connection. Alternatively, a user can also communicate with a hard wire SCADA connection. The computer 300 may access any parameter and set any threshold at the TCM system 100.

Referring to FIGS. 1-8, the VCM 14 (140, 1400) may be coupled to a plurality of sensors (e.g., solid state sensors) that measure operating parameters, including, temperature, fluid level, pressure, current, and voltage in the transformer 200. The sensor may continuously or intermittently measure the operating parameters. The plurality of sensors output measurement signals, which include a temperature signal, a fluid level signal, a pressure signal, a current signal, and a voltage signal. The measurement signals may be digital or analog. The VCM may receive the plurality of measurement signals of the transformer operation and that of the other devices monitoring the transformer, and process the received signals for various different goals, including, for example, to simulate: the function of a Sudden Pressure Relay (SPR) device (not shown) on the transformer 200; the winding temperature in the transformer 200; and the activation of the Pressure Relief Device. Thus, an SPR may be eliminated or not included. Similarly, a contact for a PRD may be eliminated or not included.

As seen in FIG. 8, the TMC system 100 may be affixed to, or located near the transformer 200. The TMC 100 may receive (or transmit) data from the computer 300 via the communication link(s) 500 directly or through the network 400. The TMC 100 may allow a user to access and control the TMC 100 via the computer 300 from anywhere in the world. Further, the user may access and/or control the transformer 200 via the computer 300 (and the TMC 100) from anywhere in the world.

The TMC 100 may be configured to receive and process one or more measurement signals from one or more sensors to generate one or more correction parameters. The correction parameters may include, for example, a temperature correction, a fluid level correction, a pressure collection, a voltage correction, a current correction, and the like. The TMC 100 may generate the correction parameters by comparing a measurement signal (e.g., a temperature measurement signal, a fluid level measurement signal, a pressure measurement signal, a voltage measurement signal, a current measurement signal, and the like) to a threshold value for the respective operating parameter (e.g., a temperature set point, a fluid level set point, a pressure set point, a voltage set point, a current set point, and the like).

According to an embodiment of the disclosure, the TMC 100 may receive measurement signals from the plurality of sensors, which may include substantially real time measurement values for, for example, temperature, fluid level, pressure, voltage level, current level, and the like, in the transformer 200. The TMC 100 may compare the measured values (e.g., measurement signals) to respective threshold values, including, e.g., a temperature threshold value, a fluid level threshold value, a pressure threshold value, a voltage level threshold value, a current level threshold value, and the like. Based on the result of the comparison, the TMC 100 may generate a diagnosis signal, which may include an indication of one or more faults, one or more less-than-optimal performance characteristics in the transformer 200, or the like. For instance, the diagnosis signal may include an indication that the fluid level in the transformer 200 is below the fluid level threshold value, indicating, e.g., a fluid leak in the transformer 200 (e.g., a leaking fitting, gasket or the like). Further, the diagnosis signal may include an indication that the pressure in the transformer 200 is above (or below) a pressure threshold value, which may indicate, e.g., an abnormally functioning component in the transformer 200.

The respective threshold values may be programmed or preset. In an embodiment of the disclosure, the threshold values may be programmed or set by a user at the computer 300 and sent to the TMC 100 via the communication link(s) 500 and/or network 400. The threshold values may be stored in the memory (not shown) in the TMC 100. In generating a diagnosis signal, the TMC 100 may monitor, e.g., temperature, fluid level, and pressure over time to detect patterns that may be indicative of faults or improper operation of the transformer 200. For example, the TMC 100 may monitor the rate of change (e.g., rise or lowering) in the temperature, the rate of change (e.g., rise or lowering) in fluid level, and/or the rate of change (e.g., rise or lowering) in pressure.

The TMC 100 may monitor a relationship over time between temperature and fluid level, temperature and pressure, and fluid level and pressure to identify faults, improper operation, or less than optimal performance of the transformer 200. The TMC 100 may normalize the fluid level to temperature (or pressure), so as to provide increased accuracy by taking into consideration temperature (or pressure) effects on the fluid level over time (or during discrete intervals). In one aspect, a processor (e.g., 300, 600) may normalize the rate of change in the fluid level to the rate of change in the temperature. The TMC 100 may monitor the rate of change of temperature in the transformer 200 relative to the rate of change in the fluid level (and/or pressure) in the transformer 200. The TMC 100 may further monitor the rate of change of the fluid level in the transformer 200 relative to the rate of change in pressure in the transformer 200. The TMC 100 may then generate a diagnosis signal based on the monitored rates of change in temperature, fluid level, and pressure, which indicates the operational status of the transformer 200, including potential faults or performance problems. This may also indicate a loss of oil in the transformer. The diagnosis signal may be sent from the TMC 100 to the computer 300 via the communication link(s) 500. As noted earlier, the TMC 100 may receive control signals, threshold values, and the like, from the computer 300. The processor (e.g., 300, 600) may monitor a rate of change in the temperature signal and a rate of change in the fluid level signal and a rate of change in the pressure level and outputs a signal based on a threshold being exceeded between any of these rate of change signals for detecting potential fault such as for determining a leak of oil.

Further, the TMC 100 may compare monitored levels (e.g., from the received measurement signals) to the threshold (or set point) values (e.g., stored in the TMC 110), and, if one or more levels are exceeded, the TMC 100 may generate an alarm signal that may be sent to the computer 300 or manifested locally at the TMC 100 as an audible signal, a visible signal, a vibration, or the like. For instance, the TMC 100 may measure the range of fluid level, pressure and temperature anticipated in the transformer 200. The TMC 100 may also provide the rate of rise of pressure for the SPR and output a measured pressure value, which may trigger an alarm condition should the measured pressure value reach or exceed a predetermined pressure threshold value. The user, using the computer 300 (or directly at the transformer 200), may take corrective action or logical action via the TMC 100, and more specifically the VCM 14 (140 or 1400) in the TMC 100. The corrective action may include, for example, actuating a fan to cool the transformer, actuating a pressure release valve, actuating a fluid injection valve, stepping down (or up) a voltage, dispatching a repair crew, switching to another transformer, or the like. The TMC 100 includes an internal memory (not shown) that may store measured parameters, predetermined set points, historical data, and the like.

The TMC 100 may process received pressure signals (e.g., pressure readings) to sense PRD and SPR conditions, as well as vacuum or pressure conditions. The TMC 100 may compare a sensed pressure to a preset level, triggering an alarm if the sensed pressure reaches or exceed the preset level. The alarm may include an alarm signal that is transmitted to the computer 300 (shown in FIG. 8).

The TMC 100 may process a received current transformer (CT) signal to calculate a winding temperature for the transformer 200. Moreover, the TMC 100 may measure the oil temperature in the transformer 200 such as by using a thermo couple (TC).

The TMC 100 may include, for example, fluid level detector which may comprise a magnetic encoder with a float arm to provide the information for the TMC 100 to calculate the fluid level in the transformer 200. The TMC 100 may further include a PLC and other components, which may be programmed to make calculations based on the received measurement signals and to display the physical quantities in common units such as PSI, degrees C. and inches on, for example, the computer 300.

The measurement signals that are received by the TMC 100 may include data samples that are taken periodically and stored in the memory (not shown). The data samples may be accessible for download (or upload) via the communication link(s) 500 and network 400 by the computer 300. This data samples may be charted and analyzed to determine abnormal conditions.

For example, the computer 300 (or TMC 100) may compare temperature behavior of the transformer 200 to the current flowing in one or more of the transformer 200 windings. If a determination is made that the temperature behavior does not correspond with the current flowing in the transformer winding(s), then a fault condition may be determined to exist within the transformer 200. A fault signal may be generated and sent for the transformer 200.

The TMC 100 may monitor other characteristics (or attributes) of the transformer 200, including, for example, an LTC (Load Tap Change) position, an LTC temperature, a dissolved gas value, and the like. The TMC 100 may collect and process the detected characteristics to relate the monitored characteristics to the transformer operation to analyze the conditions in the transformer 200. Moreover, the TMC 10 (or processor 600) may generate an alarm based any one or more received signal (e.g., a LTC position signal, a gas signal and the like).

The instant disclosure sets forth an approach that provides increased accuracy of measurement, by including, inter alia: solid state sensors that may provide analog signals with high accuracy and high reliability (compared to mechanical instruments); comparators that compare analog signals to programmed levels and logical decisions, generating comparison result signals that may be digitally communicated to a user located remotely at the computer 300; adjustable (or programmable) set points, which may he locally adjusted at the TMC 100 or the computer 300; and the like.

The TMC 100 simplifies the monitoring process of a transformer greatly. With the ability to download related data at any time, periodic variations in a unit can be compared, charted and analyzed to adjust for optimal settings and performance of the transformer unit. With the ability to make remote adjustments, time and expenses are spared for a customer in making these adjustments. Changes can he made that do not necessarily require the physical presence of sending a field service technician or maintenance personnel on site, thereby resulting in a very large savings. Efficiency and performance of the transformer itself are increased because of the automated process. From a manufacturing perspective, this module incorporates other functions that reduce manufacturing time and overall costs.

Table 1 illustrates a feature comparison between the VCM 14 (140 or 1400) of the present disclosure compared to existing ETM devices, including a Qualitrol 509 device, an Advanced TTC-1000 device, and an SEL 2414 device.

TABLE 1

| ETM DEVICES | | | |
|---|---|---|---|
| VCM | Qualitrol 509 | Advanced TTC-1000 | SEL 2414 |
| Monitors liquid temp., winding temp, load current, oil level, mechanical alarm, ambient temp. | Monitors liquid temp., winding temp., load current, oil level, mechanical alarm, ambient temp. | Monitors liquid temp., winding temp., load current, ambient temp. | Monitors oil level, ambient temp., hot spot, sudden pressure, gas accumulation, load current |
| SCADA outputs (10-1 mA or 4-20 mA) | SCADA outputs(10-1 mA or 4-20 mA) | SCADA outputs(10-1 mA or 4-20 mA) | SCADA outputs(10-1 mA or 4-20 mA) |
| Optional LTC monitoring and gas monitoring | Integrated LTC differential temperature monitoring to detect LTC failures and provides advanced warning | Built in LTC condition monitoring, optional LTC position monitoring | Optional LTC oil monitoring |
| Data logging records activities and data is available for download | Sequence of events for data logging records activities at the time of an alarm | Data logging features permits recording of time stamped temperature and load data | Sequential event reporting and logging with synchronized time stamps |
| Compatible with RTD's, CT's | Compatible with RTD's, CT's, voltage, current loops and switch contacts | Compatible with RTD's, CT's | Compatible with RTD's, CT's |
| Control cooling fans | Control cooling fans and pumps | Control cooling fans and pumps | Control cooling fans |
| Panel mounting, NEMA 4x enclosure, NEMA 4x enclosure with heater available options | Panel mounting, NEMA 3R enclosure available options | Penal mounting NEMA 4X enclosure, NEMA 4X enclosure with heater available options | Panel mountain, surface mounting available options |
| Communications interface: RJ485, DNP 3.0 protocol or MODBUS | Communications interface: RS232, RS485, Fiber optic, USB, DNP 3.0 protocol or MODBUS | Communications interface: RS485, RS232, DNP 3.0 protocol or MODBUS | Communications interface: EIA 232, Fiber optic, EIA 485, DNP 3.0 protocol or MODBUS |
| Operating temp range:- −40° C. to 85° C. | Operating temp range: −40° C. to +72° C. | Operating temp range: −50° C. to +85° C. | Operating temp range: −40° C. to 85° C. |
| Accepts up to 8 inputs. Output relays with Form C contacts | Accepts up to 8 inputs. Output relays with Form C contacts | Accepts up to 14 optically isolated digital inputs. Output relays with Form C contacts | Accepts up to 12 digital/analog inputs. Output relay with Form C contacts |
| Allows to calculate loss of life of transformer by generating hourly and daily data | TransLife feature allows to compute loss of life rate, life consumption and remaining life of the transformer | | Allows to calculate loss of life of transformer by generating hourly and daily data |

The TMC 100 provides various functions that lead to even greater advances in the protection and diagnosis of the operating conditions in transformers. By combining the disclosed functions and features into a single module, the long term operation of a power transformer may be monitored easily and corrective action taken in case of anomalous conditions. Thus, the maximum life of a transformer can be achieved.

According to an aspect of the disclosure, a computer readable medium is provided that contains a computer program, which when executed in, for example, the TMC 100 (or the computer 300) causes the processes described herein to be carried out. The computer program may be tangibly embodied in the computer readable storage medium, which may comprise a code segment or a code section for each of the steps described herein.

While the disclosure has been described in terms of exemplary embodiments, those skilled in the art will recognize that the disclosure can be practiced with modifications in the spirit and scope of the appended claims. These examples are merely illustrative and are not meant to be an exhaustive list of all possible designs, embodiments, applications or modifications of the disclosure.

What is claimed:

1. A system for monitoring operating parameters of a transformer, the system comprising:
    a temperature sensor that measures temperature in the transformer and outputs a temperature signal;
    a fluid level sensor that measures a level of fluid in the transformer and outputs a fluid level signal;
    a pressure sensor that measures pressure in the transformer and outputs a pressure signal;
    a plurality of pressure switches for indicating different pressures; and
    a processor that receives the temperature signal, the fluid level signal, and the pressure signal, wherein the processor is configured to generate a diagnosis signal to a remote computer over a network based on at least one of the temperature signal, fluid level signal, and pressure signal, and the processor configured to receive a corrective action from the remote computer to perform corrective action at the transformer based on the diagnosis signal, and the processor operatively coupled to the plurality of pressure switches for indicating different detected pressures based on the pressure sensor.

2. The system of claim 1, further comprising:
    a current transmitter that measures the current in the transformer and outputs a current signal; and
    a temperature sensor that measures the ambient temperature of the transformer and outputs an ambient temperature signal,
    wherein the processor is configured to generate a diagnosis signal based on at least one of the current signal and the ambient temperature signal.

3. The system of claim 1, further comprising:
    a gas analyzer to provide a signal for gases generated in the transformer, wherein the processor is configured to generate a diagnosis signal based on the signal for gases.

4. The system of claim 1, further comprising:
    a sensor that senses the LTC tap position and outputs a LTC position signal wherein the processor is configured to generate a diagnosis signal based on the LTC position signal.

5. The system of claim 4, wherein the sensor that senses the LTC tap position provides a signal to indicate one of: a tap is stuck between taps, a neutral position, an extreme low position and an extreme high position.

6. The system of claim 1, wherein the processor monitors a rate of change in the temperature signal and a rate of change in the fluid level signal and a rate of change in the pressure level and outputs a signal based on a threshold being exceeded between any of these rate of change signals for determining a leak of oil.

7. The system of claim 2, wherein the processor normalizes the rate of change in the fluid level to the rate of change in the temperature by taking into account temperature effects on the fluid level over time.

8. The system of claim 1, wherein the processor receives a threshold value from a computer memory, and calculates a percent loss of life of the transformer.

9. The system of claim 8, wherein the processor activates an alarm based on the percent loss of life reaches a predefined threshold.

10. The system of claim 1, wherein the processor detects a condition of the transformer based on a dissolved gas analysis.

11. The system of claim 2, wherein the processor generates an alarm based on any one or more received signal.

12. The system of claim 1, wherein the processor receives the temperature signal, the fluid level signal, and the pressure signal over a wireless link.

13. The system of claim 1, wherein the corrective action includes at least one of: actuating a fan, actuating a valve, changing a voltage, switching to another transformer.

14. The system of claim 11, wherein the alarm comprises an audible alarm, a visible alarm or a vibration.

15. The system of claim 1, wherein the processor is configured to determine whether the measured temperature exceeds a temperature threshold value, whether the measured fluid level exceeds a fluid level threshold value, and whether the measured pressure exceeds a pressure threshold value level, wherein each threshold value is programmable from the remote computer.

16. A method for monitoring or controlling a transformer comprising the steps of:
    sending at least one threshold value over a network to a transformer monitoring device;
    receiving at least one signal from the transformer monitoring device indicative of a condition of a transformer that exceeded the at least one threshold value; and
    raising an alarm indicating a potential fault at the transformer.

17. The method of claim 16, further comprising at least one of the following steps:
    (a) receiving a temperature signal from the transformer monitoring device indicative of a temperature of the transformer;
    (b) receiving a fluid level signal from the transformer monitoring device indicative of a fluid level in the transformer;
    (c) receiving a pressure level signal from the transformer monitoring device indicative of an amount of pressure in the transformer;
    (d) receiving a current signal from the transformer monitoring device indicative of a current in the transformer;
    (e) receiving an ambient temperature signal from the transformer monitoring device indicative of ambient temperature of the transformer;
    (f) receiving a gas signal from the transformer monitoring device indicating a level of gases generated in the transformer;
    (g) receiving a LTC position signal from the transformer monitoring device indicative of a position of the LTC position;
    (h) monitoring a rate of change in the temperature signal, a rate of change in the fluid level signal and a rate of change in the pressure level and outputting a signal based on a threshold being exceeded between any of these rate of change signals for determining a fault;

(i) calculating a percent loss of life of the transformer based on at least one of the signals exceeding a parameter;

(j) wherein the step of raising an alarm raises an alarm based on at least one of the signals.

18. The method of claim 17, wherein in each of the receiving steps, each respective signal is received over a wireless link.

19. The method of claim 16, further comprising sending a corrective action message to the transformer monitoring device to perform corrective action at the transformer based on the received at least one signal.

20. The method of claim 19, wherein the corrective action includes at least one of: actuating a fan, actuating a valve, changing a voltage, switching to another transformer.

21. A computer program embodied on a non-transitory computer readable storage medium, the computer program comprising executable code that when read and executed by a processor performs the following steps:

receiving a temperature signal from a transformer monitoring device indicative of a temperature of a transformer;

receiving a fluid level signal from the transformer monitoring device indicative of a fluid level in the transformer;

receiving a pressure level signal from the transformer monitoring device indicative of an amount of pressure in the transformer;

receiving a current signal from the transformer monitoring device a current transmitter that measures the current in the transformer and outputs a current signal;

receiving an ambient temperature signal from the transformer monitoring device indicative of ambient temperature of the transformer;

receiving a gas signal from the transformer monitoring device indicating a level of gases generated in the transformer;

receiving a LTC position signal from the transformer monitoring device indicative of a position of the LTC position;

monitoring a rate of change in the temperature signal, a rate of change in the fluid level signal and a rate of change in the pressure level and outputting a signal based on a threshold being exceeded between any of these rate of change signals for determining a fault;

calculating a percent loss of life of the transformer based on at least one of the signals exceeding a parameter; and raising an alarm based on at least one of: any of the signals exceeding a remotely programmable threshold and calculated percent loss of life of the transformer, and taking corrective action at the transformer as received from a remote computer to perform corrective action at the transformer.

22. The computer program of claim 21, wherein the corrective action includes at least one of: actuating a fan, actuating a valve, changing a voltage, switching to another transformer.

* * * * *